(12) United States Patent
Lian et al.

(10) Patent No.: US 6,891,190 B2
(45) Date of Patent: May 10, 2005

(54) ORGANIC SEMICONDUCTOR DEVICE AND METHOD

(75) Inventors: Ke Keryn Lian, Palatine, IL (US); Robert T. Croswell, Hanover Park, IL (US); Aroon Tungare, Winfield, IL (US); Manes Eliacin, Buffalo Grove, IL (US)

(73) Assignee: Motorola, Inc., Schaumburg, IL (US)

( * ) Notice: Subject to any disclaimer, the term of this patent is extended or adjusted under 35 U.S.C. 154(b) by 0 days.

(21) Appl. No.: 10/154,013

(22) Filed: May 23, 2002

(65) Prior Publication Data

US 2003/0218165 A1 Nov. 27, 2003

(51) Int. Cl.$^7$ ................................................ H01L 29/76
(52) U.S. Cl. ..................... 257/40; 257/310; 257/642; 257/759
(58) Field of Search ..................... 257/40, 275, 310, 257/642, 759

(56) References Cited

U.S. PATENT DOCUMENTS

| | | | | |
|---|---|---|---|---|
| 5,739,193 A | * | 4/1998 | Walpita et al. | .............. 524/413 |
| 5,800,683 A | * | 9/1998 | Kammerdiner et al. | 204/192.12 |
| 6,103,134 A | | 8/2000 | Dunn et al. | |
| 6,349,456 B1 | | 2/2002 | Dunn et al. | |
| 6,433,359 B1 | * | 8/2002 | Kelley et al. | ................. 257/40 |
| 6,495,413 B2 | * | 12/2002 | Sun et al. | ................... 438/240 |
| 6,586,791 B1 | * | 7/2003 | Lee et al. | ................... 257/295 |
| 6,620,657 B2 | * | 9/2003 | Breen et al. | ................ 438/151 |
| 2001/0048379 A1 | * | 12/2001 | Kaikuranta et al. | ........... 341/22 |
| 2003/0102472 A1 | * | 6/2003 | Kelley et al. | ................. 257/40 |

OTHER PUBLICATIONS

Dimitrakopoulos, C.D., Purushothaman, S., Kymissis, J., Callegari, A., Shaw, J.M., "Low–voltage organic transistors on plastic comprising high–dielectric constant gate insulators," Science, Feb. 5, 1999, vol. 283, pp. 822–824.*

Bao, Z., Rogers, J.A., and Katz, H.E., "Printable organic polymeric semi–conducting materials and devices," J. Mater. Chem., 1999, vol. 9, pp. 1895–1904.*

Bao, Z., and Lovinger, A.J., "Soluble regioregular polythiophene derivatives as semiconducting materials for field–effect transistors," Chem. Mater., 1999, vol. 11, pp. 2607–2612.* http://www.emtonthenet.net/glossary/fr4laminate.html, published in 2002 by the Electronics Manufacture and Test Group (UK).*

C. D. Dimitrakopoulos, S. Purushothaman, J. Kymissis, A. Callegari, J. M. Shaw, "Low–Voltage Organic Transistors on Plastic Comprising High–Dielectric Constant Gate Insulators", Science Magazine, vol. 283, No. 5043, Issue of Feb. 5, 1999, pp. 822–824.

Bao Zhenan, John A. Rogers, and Howard E. Katz, "Printable Organic and Polymeric Semiconducting Materials and Devices", Journal of Materials Chemistry, 1999, vol. 9, pp. 1895–1904.

* cited by examiner

*Primary Examiner*—Minhloan Tran
*Assistant Examiner*—Thomas L. Dickey

(57) ABSTRACT

An organic semiconductor device (11) can be embedded within a printed wiring board (10). In various embodiments, the embedded device (11) can be accompanied by other organic semiconductor devices (31) and/or passive electrical components (26). When so embedded, conductive vias (41, 42, 43) can be used to facilitate electrical connection to the embedded device. In various embodiments, specific categories of materials and/or processing steps are used to facilitate the making of organic semiconductors and/or passive electrical components, embedded or otherwise.

21 Claims, 3 Drawing Sheets

ORGANIC SEMICONDUCTOR DEVICE AND METHOD

TECHNICAL FIELD

This invention relates generally to semiconductors and more particularly to organic semiconductor materials.

BACKGROUND

Components and circuits comprised of semiconductor materials are known in the art. Such technology has been highly successful. For some applications, however, traditional semiconductor processing over-performs and represents unneeded form factors and capabilities at a commensurate additional cost. Traditional semiconductor processing also usually requires batch processing to achieve a reasonable cost per part because the fabrication facilities and equipment required are extremely expensive. Also, many semiconductor devices require a lengthy fabrication time and often require numerous chemicals, some of which are highly toxic and require special handling. These aspects of traditional semiconductor fabrication do not well support low data storage and data transmission rate applications and/or other less expensive needs.

Organic semiconductors have been proposed as an alternative to standard semiconductor paradigms. Organic semiconductors hold the potential for serial or continuous processing and/or otherwise relatively low cost manufacturing requirements. One particularly important goal is to discover materials and methods that would facilitate complimentary exploitation of organic semiconductors using standard printed wiring board materials and methods.

BRIEF DESCRIPTION OF THE DRAWINGS

The above needs are at least partially met through provision of the organic semiconductor device and method described in the following detailed description, particularly when studied in conjunction with the drawings, wherein.

Skilled artisans will appreciate that elements in the figures are illustrated for simplicity and clarity and have not necessarily been drawn to scale. For example, the dimensions of some of the elements in the figures may be exaggerated relative to other elements to help to improve understanding of various embodiments of the present invention. Also, certain common elements, even though essential to a commercial realization, are often not show for purposes of brevity and preservation of focus.

DETAILED DESCRIPTION

Generally speaking, pursuant to some of these various embodiments, an organic semiconductor device is encapsulated within a printed wiring board. If desired, a plurality of such devices can be so encapsulated and/or passive components can be similarly embedded therewith. When so embedded, conductive vias can be used to provide an electrical interface to such devices. In other embodiments, regardless of whether the resultant organic semiconductor device is embedded or not, printed wiring board fabrication techniques are usefully leveraged to form an organic semiconductor device. As to the latter, use of certain ceramic-filled polymer materials or thin-film perovskite materials as a dielectric for the organic semiconductor device serves well.

Figure 1:
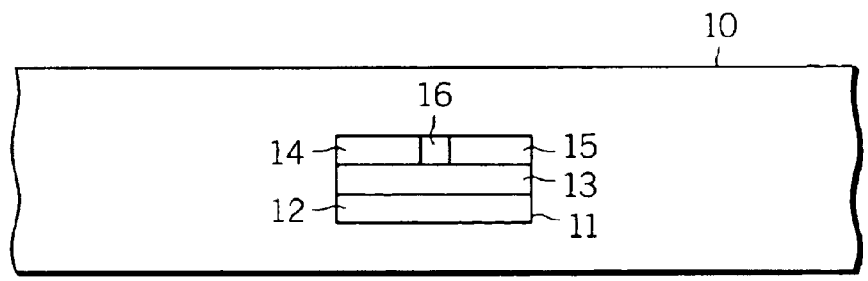
FIG. 1 illustrates a first embodiment configured in accordance with the invention.

Referring now to FIG. 1, a first embodiment will be described. A printed wiring board 10 can be comprised of a variety of materials, including flexible and substantially rigid materials. In general, the board 10 itself should be an insulator such as a glass reinforced composite as is commonly used as a printed wiring board laminate (for example, FR-4 material). Various plastics, including thin flexible sheets such as polyimide, generally work well for these purposes. Depending upon the application, however, other materials can work as well, including treated cloth and paper. The board 10 can be of various sizes as commensurate with the desired size of the final result. Typically, the resultant board 10 will comprise a laminated structure that is formed of numerous thinner layers.

Pursuant to this embodiment, an organic semiconductor device 11 is embedded within the board 10. For purposes of this description, the device 11 is a FET (field effect transistor) comprised of a gate electrode 12, a source electrode 14, and a drain electrode 15 and having a dielectric layer 13 disposed between the gate electrode 12 on the one hand and the source and drain electrodes 14 and 15 on the other hand. An organic semiconductor material 16 lies between the source electrode 14 and drain electrode 15. (Conductive paths to each electrode 12, 14, and 15 would ordinarily be provided to facilitate desired functionality; for purposes of clarity and focus, such paths are not depicted in these figures.)

Figure 2:
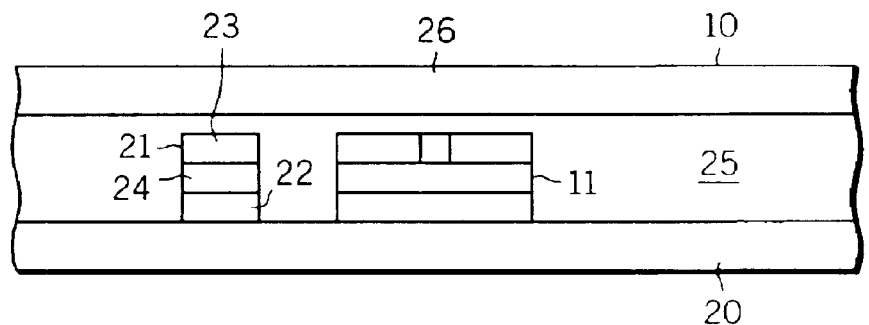
FIG. 2 illustrates a second embodiment configured in accordance with the invention.

As noted earlier, printed wiring boards comprise a plurality of laminated layers. With reference to FIG. 2, a printed wiring board 10 formed of a plurality of individual electrically insulative layers can readily include an organic semiconductor device 11 as generally described above as formed upon a first substrate 20 (such as an FR-4 core). Further, such a board 10 can also include one or more embedded mezzanine-layer passive electrical components such as a capacitor 21. In this embodiment, the exemplary capacitor 21 includes two conductive sections 22 and 23 that are separated by a dielectric layer 24. Such a passive electrical component can be readily electrically coupled to the organic semiconductor device 11 with conductive traces that are formed in accordance with well understood prior art printed wiring board fabrication techniques. Resin 25 can fill in around these embedded components and, if desired, a conductive coating 26 (such as copper) can be disposed over the upper surface to permit ordinary use as a printed wiring board.

Figure 3:
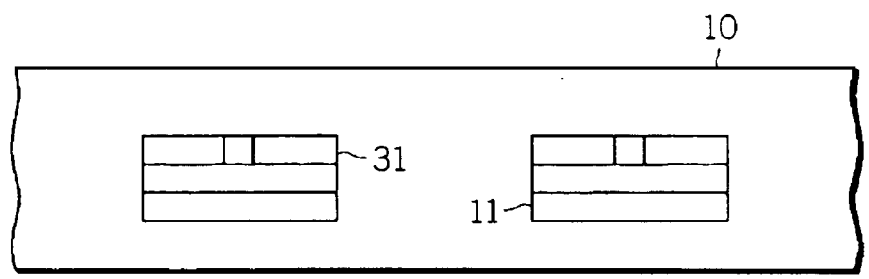
FIG. 3 illustrates a third embodiment configured in accordance with the invention.
Figure 4:
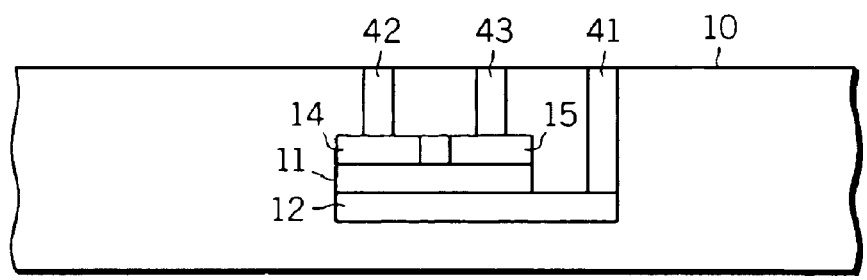
FIG. 4 illustrates a fourth embodiment configured in accordance with the invention.

In addition to embedded passive electrical components, of course, additional organic semiconductor devices 31 can also be embedded as generally illustrated in FIG. 3 with interconnections again being provided as appropriate to permit formation of one or more desired circuits. When embedding organic semiconductor devices within a printed wiring board 10, of course, it will be sometimes desirable to have electrical access to such devices from the exterior of the board 10. Conductive vias can be used to provide such external access. For example, a first conductive via 41 can couple to the gate 12 of the organic semiconductor device 11 and second and third conductive vias 42 and 43 can couple to the source 14 and drain 15 as depicted in FIG. 4. (Formation of such vias is well understood in the art and hence additional description will not be provided here for the sake of brevity.)

Forming organic semiconductor devices within a printed wiring board offers a variety of potential advantages. The total required form factor for a given device may be reduced by using this approach (especially when additional devices can be formed or otherwise mounted on the external surface of the board). Special applications are also possible. For example, the embedded circuitry could comprise a display driver. "Blank" boards with such a driver could then be utilized by a given user to support a variety of different circuits placed on the external surface of the board that can make use of such a display without having to design or place the corresponding display driver on those external surfaces.

As noted, an organic semiconductor device can be embedded in a printed wiring board using standard printed wiring board fabrication techniques. The applicant has also determined, however, that at least for some applications, judicious selection of certain materials permits particular ease of fabrication and performance of the resultant device. Description of various materials and approaches to fabrication will now be provided through various examples (it should also be noted that the described materials and fabrication techniques are suitable for use in forming organic semiconductor devices (and passive electrical components) in general, regardless of whether all or part of the resultant device is embedded within a printed wiring board or resides on a surface thereof).

EXAMPLE 1

Figure 5:
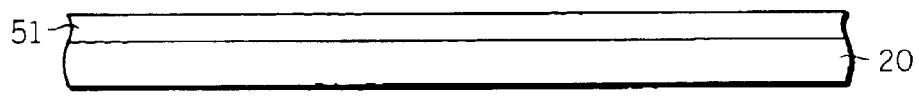
FIGS. 5 through 11 illustrate a series of steps pursuant to a variety of embodiments in accordance with the invention.
Figure 6:
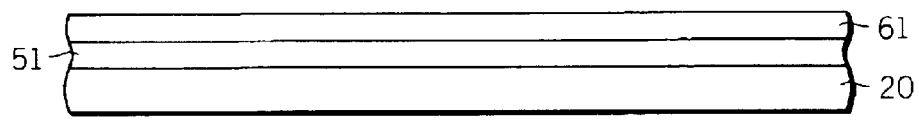

Referring now to FIG. 5, one can begin with a copper-clad laminate comprising an insulating substrate 20 and a copper layer 51 disposed thereover. The copper layer 51 can range in thickness from 5 to 60 microns (though 10 to 18 microns comprises a good workable range for many purposes). The surface of the copper layer 51 can be treated to at least slightly roughen the surface (such as, for example, by black oxidation or by chemically etching the surface with an anisotropic etch such as MEC Etch, an anisotropic copper etchant produced by MEC Corporation of Japan). Referring now to FIG. 6, a layer 61 of ceramic-filled positive-acting photodielectric polymer (CFP) such as, for example, Probelec CFP from Vantico A. G. (which has a barium titanate content of about 45 volume percent) is coated over the copper layer 51 (U.S. Pat. No. 6,103,134 provides additional description of ceramic-filled positive-acting photodielectric materials.) This material can be applied using a variety of known printed wiring board fabrication techniques including vertical roller coating, curtain coating, screen printing, and so forth. The CFP thickness can reasonably vary from 5 to 20 microns with 5 to 15 microns comprising a good workable range for many purposes. Portions of this CFP layer 61 will eventually comprise a dielectric portion of an organic semiconductor device. Materials such as Probelec have a dielectric constant of about 21 at 1 MHz and exhibit a loss tangent of 2 to 4%, making the material suitable for this purpose.

Various solvents may be used to achieve a good working viscosity of the CFP material during the above coating process. When used, it is useful to drive off at least a portion of such solvents. Drying the CFP material at about 65 to 75 degrees Celsius for approximately 20 minutes will usually suffice for this purpose, leaving a CFP material that remains similar to a B-stage epoxy.

Figure 7:
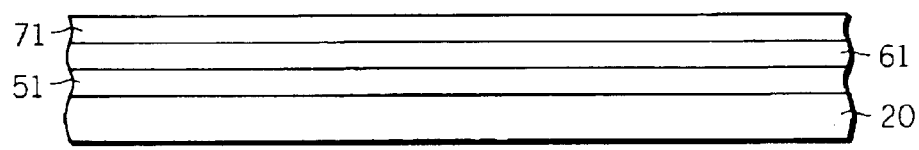

Referring now to FIG. 7, a copper layer 71 is laminated on the CFP layer 61 using low lamination temperatures to thereby assure affixment of the copper layer 71 while avoiding altering the photodefinition characteristics of the CFP material itself. For example, using a lamination temperature of about 75 degrees Celsius and a pressure of about 180 pounds per square inch for about 20 to 25 minutes should produce acceptable results, especially when slowly ramping the heating and cool down cycles (for example, around 3 degrees Celsius per minute is an acceptable rate of achieving the desired heating temperature and of cooling down from that temperature). In a preferred embodiment the lamination will occur in a vacuum. The copper layer 71 itself can range in thickness from about 5 microns to 18 microns (depending upon the application, however, thinner or thicker layers can be used if desired).

Figure 8:
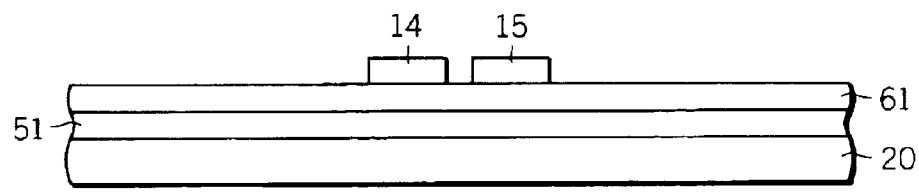

Referring now to FIG. 8, standard printing and etching techniques are usable to form source and drain electrodes 14 and 15. The gate distance between these two electrodes constitutes an important parameter and typically needs to be maintained relatively small. Depending in part upon the thickness of the laminated copper layer 71 itself, gate distances of between about 5 to 75 microns are relatively easily achieved using such known techniques.

Standard photomasking techniques are then employed to selectively expose portions of the CFP layer 61 to ultraviolet radiation (note that standard photomasking materials may be useful when masking CFP that underlies the gate section between the source and drain electrodes 14 and 15). Portions of the CFP layer 61 that are exposed to such ultraviolet radiation are thereafter rendered more soluble to certain solvents such as Gamma-Butyrolactone ("GBL"). In a preferred embodiment, the resultant structure is then exposed to a heat bump of, for example, approximately 110 to 120 degrees Celsius for about 60 to 75 minutes. Such heating tends to render the unexposed portions of the CFP layer 71 less soluble and further renders the ultraviolet exposed portions even more soluble to solvents such as GBL.

Figure 9:
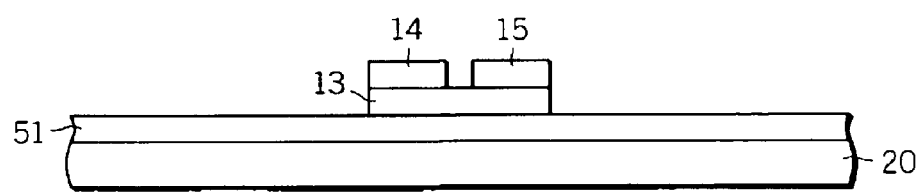
Figure 10:
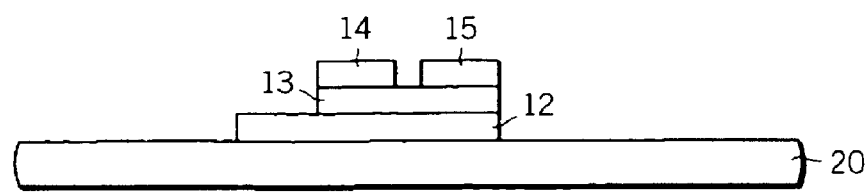

Referring to FIG. 9, a solvent such as GBL is used to develop away portions of the CFP layer 71 that were exposed to ultraviolet radiation. The unexposed portion remains and comprises, in this embodiment, the dielectric layer 13 for the organic semiconductor device under construction. The structure will then preferably be baked for about 1 hour at about 150 degrees Celsius to cure the remaining CFP material and hence affix the dielectric materials as well as the laminated copper materials. Referring now to FIG. 10, the exposed copper layer 51 can now be printed and etched using standard fabrication techniques to both form the gate electrode 12 and any other conductive traces and pads as may be desired to support a particular circuit configuration.

In a preferred embodiment, the copper surface of the source and drain electrodes 14 and 15 (and any exposed portions of the gate electrode 12) are finished with an electroless nickel immersion gold finish. Such a finish aids in ensuring a good Ohmic contact between the source and drain electrodes 14 and 15 and the organic semiconductor material that is later deposited. Other finishes could of course be utilized to achieve this same purpose, including but not limited to palladium, silver, and platinum.

Figure 11:
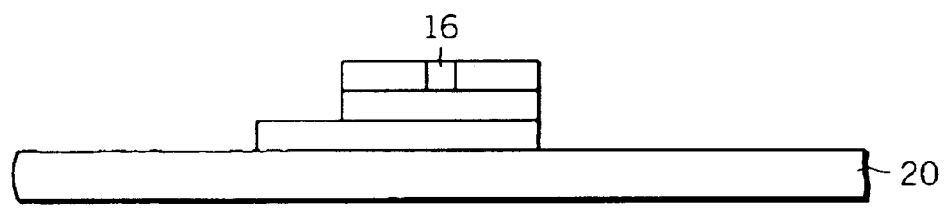

Referring now to FIG. 11, organic semiconductor material 16 is deposited at least in the gate between and contacting the source and drain electrodes 14 and 15 via any appropriate process, including screen printing, spin coating, data driven deposition, and so forth. A variety of materials can be used for this purpose, including but not limited to polythiophene (and its various derivatives), pentacene, phthalocyanin, $C_{60}$, and other semiconductor-organic nanocomposites.

The resultant FET can demonstrate effective carrier mobility on or below the order of 1 $cm^2/V \cdot s$ and current on/off ratios greater than $10^6$. If desired, the resultant FET can be readily embedded by depositing subsequent layers of, for example, resin-coated copper material or FR-4 material around and over the FET itself as depicted above. The FET will function properly even if not embedded, of course, thereby rendering the above described techniques useful in both cases. And, again as referenced above, conductive vias can be readily formed to provide electrical connections to embedded portions of such an FET.

The use of CFP materials in the above example allows for provision of a good dielectric while simultaneously ensuring that standard printed wiring board techniques are acceptably used and leveraged. Various CFP materials that comprise a photoimagable dielectric-ceramic composite material can be used for these purposes. One particularly useful kind of CFP material to use in this context comprises an epoxy base that is mixed with perovskite particles such as barium titanate (in a preferred embodiment, such particles range in size from approximately 0.2 to 5 microns).

EXAMPLE 2

Figure 12:
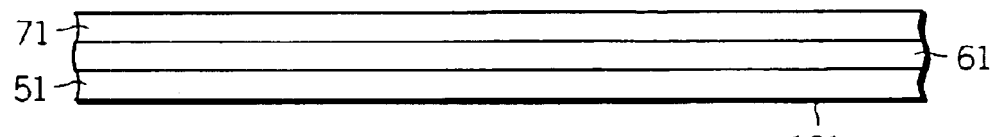
FIG. 12 illustrates an intermediary step pursuant to another embodiment in accordance with the invention.

Another way to achieve a similar result as that described above begins with provision of a laminated structure 121 as shown in FIG. 12. This laminated structure 121 includes an intervening layer 61 sandwiched between two copper layers 51 and 71. The intervening layer 61 comprises, in this embodiment, a thin-film dielectric material such as a thin-film perovskite material. Many dielectric oxides are suitable in this regard, including lead zirconate titanate (PZT), lead lanthanum zirconate titanate (PLZT), lead lanthanide titanate (PLT), lead titanate (PT), lead zirconate (PZ), lead magnesium niobate (PMN), barium titanate (BTO), and barium strontium titanate (BSTO). Dielectric oxides comprising the PLZT approach, particularly compositions comprising a PLZT formula $(Pb_{1-x}La_x)(Zr_{0.52}Ti_{0.48})O_3$, where x is about 0.15 are particularly attractive. Adding a donor-doped material such as lanthanum to PZT is useful in a preferred embodiment as the lanthanum modifies in a favorable way the electrical properties of the dielectric material. Similarly, addition of small quantities of acceptor-doped materials, such as nickel, niobium, calcium, and strontium, can also improve electrical performance. A preferred acceptor dopant is calcium, comprising a PCZT formula $Pb_{1-x}Ca_{x+y}(Zr_{0.52}Ti_{0.48})_{1-y}O_3$, where $0.05 < x+y < 0.1$. Accordingly, the dielectric oxide used in these embodiments may also contain small quanitites of these elements. The thin-film dielectric material layer 61 can have a thickness of about 0.6 to 1.0 microns. So configured, the resultant structure will have an effective dielectric constant of approximately 200 with a corresponding loss tangent of 0.005 or less. These are acceptable values that, in fact, represent a considerable improvement over current MOSFET capacitance densities.

This laminated structure 121 is then itself laminated onto a printed wiring board substrate 20, thereby yielding a structure that appears as illustrated in FIG. 7. Standard lamination techniques can be utilized to achieve this result.

As described before with reference to FIG. 8, the upper copper layer 71 is then printed and etched to form the source and drain electrodes 14 and 15. Again, the gate distance between these electrodes can range in size from a few microns to upwards of 50 microns. And again, preferably, a smaller gate size is preferred.

As before, etching the upper copper layer 71 will reveal some of the underlying dielectric material, in this case the thin-film ceramic dielectric layer 61. This thin-film material is now selectively removed, leaving only the portion 13 (see FIG. 9) desired to serve as the intervening dielectric between the gate of the organic semiconductor device being constructed and the source/drain thereof. Such removal can be effected in a variety of ways, including by brushing, pumice scrubbing, laser sciving, and so forth. (A less desirable approach would be to pre-etch the laminated structure 121 prior to laminating that structure 121 to the printed wiring board substrate 20 to form some of the above described elements.)

The device is now finished using the same techniques as described above in Example 1 to provide an organic semiconductor device as illustrated in FIG. 11. Again, additional insulating layers can be added to partially or fully embed the resultant device and plated vias can be formed as necessary to provide electrical connections to the device when so embedded.

EXAMPLE 3

The processes described in Examples 1 and 2 permit fabrication of one or more organic semiconductor devices, which devices are embedded in or otherwise supported on a printed wiring board. As noted earlier, however, it is also possible to form passive electrical components in conjunction with such devices. In this example a capacitor is formed simultaneously with an organic semiconductor device while using CFP material as a dielectric for both devices.

Figure 13:
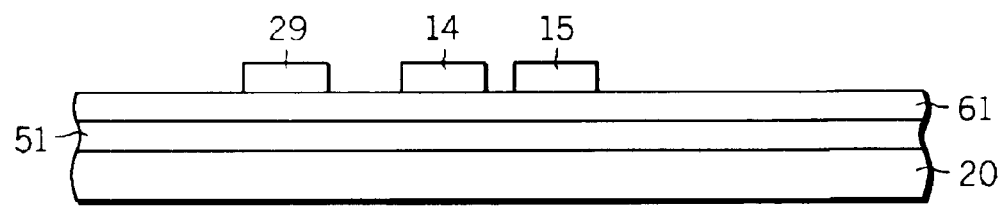
FIGS. 13 and 14 illustrate two steps pursuant to yet another embodiment configured in accordance with the invention.
Figure 14:
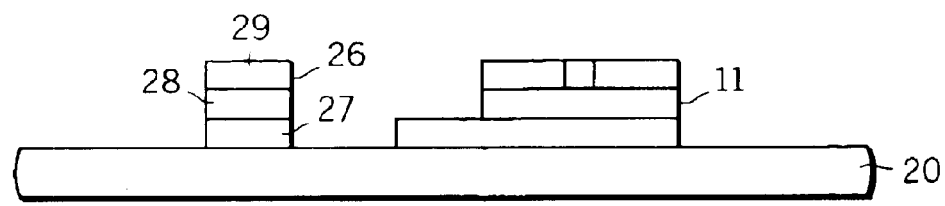

The process as described above in Example 1 can be followed in a similar manner until the step of printing and etching the top copper layer 71 (see FIG. 7). As shown in FIG. 13, in addition to defining a source and drain electrode 14 and 15 for the organic semiconductor device, an electrode 29 for a corresponding capacitor is also defined at this time. Ultraviolet light exposure and heat bumping are again used to define areas within the CFP layer 61 to be retained, and this time, in addition to defining a dielectric layer for the organic semiconductor device a dielectric layer for the capacitor is also similarly defined. The exposed portions of the CFP layer 61 are then removed as before, leaving the dielectric for the organic semiconductor device as before and also a dielectric 28 for the capacitor (as shown in FIG. 14). Similarly, when the bottom layer of copper 51 is etched, the second electrode 27 is defined for the capacitor 26 which is now seen to be comprised of two electrodes 27 and 29 having an intervening dielectric 28. Such a capacitor 26 can now be embedded within subsequent insulating layers as described above, or left as a surface component, as appropriate to the application.

If desired, when etching the lower copper layer 51, conductive traces to allow interconnection of such a capacitor 26 with, for example, the organic semiconductor device 11, can of course be formed. Or, if these components are embedded within the printed wiring board materials, conductive vias can be formed to provide electrical interconnections to the component electrodes.

The process set forth above in Example 2 can be similarly modified to also accommodate the formation of one or more passive electrical components.

Figure 15:
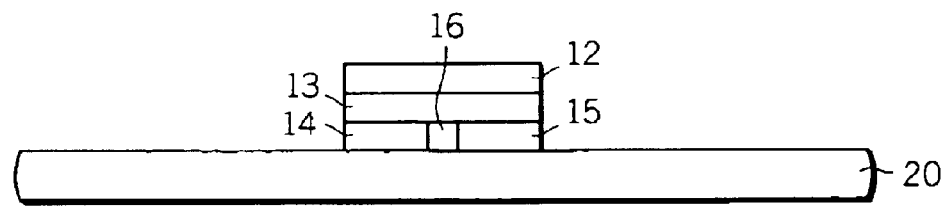
FIG. 15 illustrates yet another embodiment configured in accordance with the invention.

The embodiments and examples described above present the various elements as being stacked in a particular order. Other orientations, however, are possible and acceptable (especially with respect to the device elements themselves). For example, with reference to FIG. 15, the stacked orientation of the constituent elements can be reversed such the source and drain electrodes 14 and 15 and the intervening organic semiconductor material 16 are disposed proximal to the supporting substrate 20, with the dielectric layer 13 and the gate electrode 12 being stacked, respectively, thereon. Furthermore, the FET device described in the examples has been used as an illustrative mechanism only. These embodiments are usable with many other organic semiconductor devices and configurations as well.

A wide variety of materials can be used consistently with the above processes and embodiments. Furthermore, a wide range of processing parameters can be varied, including device size and constituent element sizes, to suit a wide variety of application requirements. Those skilled in the art will recognize that a wide variety of modifications, alterations, and combinations can be made with respect to the above described embodiments without departing from the spirit and scope of the invention, and that such modifications, alterations, and combinations are to be viewed as being within the ambit of the inventive concept.

We claim:

1. A device comprising:
    a substrate comprised of electrically insulating material;
    an organic semiconductor device embedded within the substrate, wherein the organic semiconductor device comprises a first electrode and a second electrode, which first and second electrodes are separated at least by a dielectric comprising a ceramic filled polymer material comprising a photoimageable dielectric-ceramic composite polymer material.

2. The device of claim 1 wherein the substrate is comprised of a glass reinforced composite.

3. The device of claim 1 wherein the substrate is comprised of a plurality of laminated layers of electrically insulating material.

4. The device of claim 3 wherein the organic semiconductor device is disposed on at least one of the plurality of laminated layers of electrically insulating material.

5. The device of claim 1 and further comprising a passive electrical component that is embedded within the substrate.

6. The device of claim 5 wherein the organic semiconductor device and the passive electrical component are electrically coupled to one another.

7. The device of claim 1 wherein the substrate includes at least one via providing electrically conductive access to the organic semiconductor device.

8. The device of claim 1 and further comprising a plurality of organic semiconductor devices embedded within the substrate.

9. The device of claim 1 wherein the ceramic filled polymer material has a thickness of approximately 5 to 15 microns.

10. The device of claim 1 wherein the ceramic filled polymer comprises an epoxy base mixed with perovskite particles.

11. The device of claim 10 wherein at least some of the perovskite particles comprise barium titanate.

12. The device of claim 11 wherein at least a substantial number of the perovskite particles range in size from approximately 0.2 to 5 micrometers.

13. The device of claim 1 and further comprising a third electrode, wherein the second and third electrodes are separated from the first electrode by the dielectric.

14. A device comprising:
    a substrate comprised of electrically insulating material;
    an organic semiconductor device embedded within the substrate, wherein the organic semiconductor device comprises a first electrode and a second electrode, which first and second electrodes are separated at least by a dielectric wherein the dielectric material comprises a thin-film perovskite material.

15. The device of claim 14 wherein the thin-film perovskite material comprises a lead zirconate titanate-based material.

16. The device of claim 15 wherein the thin-film perovskite material is donor-doped.

17. The device of claim 16 wherein the thin-film perovskite material is donor-doped with lanthanum.

18. The device of claim 15 wherein the thin-film perovskite material is acceptor-doped.

19. The device of claim 18 wherein the thin-film perovskite material is acceptor-doped with calcium.

20. The device of claim 14 wherein the thin-film perovskite material has a thickness of approximately 0.3 to 2.0 micrometers.

21. The device of claim 20 wherein the thin-film perovskite material has a thickness of approximately 0.5 to 1.0 micrometer.

* * * * *